(12) United States Patent
Doan et al.

(10) Patent No.: US 7,504,008 B2
(45) Date of Patent: Mar. 17, 2009

(54) REFURBISHMENT OF SPUTTERING TARGETS

(75) Inventors: Trung T. Doan, Los Gatos, CA (US); Kenny King-Tai Ngan, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 695 days.

(21) Appl. No.: 10/799,361

(22) Filed: Mar. 12, 2004

(65) Prior Publication Data

US 2005/0199486 A1 Sep. 15, 2005

(51) Int. Cl.
*C23C 2/00* (2006.01)
*C23C 6/00* (2006.01)
*C23C 14/34* (2006.01)
*C23C 30/00* (2006.01)

(52) U.S. Cl. ............... 204/192.38; 75/246; 204/298.12; 419/5; 419/8; 419/26; 427/452

(58) Field of Classification Search .................. 117/75; 204/164, 192.1, 192.38; 219/56.21; 427/452; 438/636; 451/41
See application file for complete search history.

(56) References Cited

U.S. PATENT DOCUMENTS

| | | | | |
|---|---|---|---|---|
| 3,607,067 | A | * | 9/1971 | Nickl .......................... 117/75 |
| 4,505,947 | A | * | 3/1985 | Vukanovic et al. .......... 427/452 |
| 4,905,886 | A | | 3/1990 | Kennedy et al. |
| 5,041,194 | A | | 8/1991 | Mori et al. |
| 5,342,496 | A | | 8/1994 | Stellrecht |
| 5,595,938 | A | * | 1/1997 | Miyazaki .................... 438/636 |
| 5,693,203 | A | | 12/1997 | Ohhashi et al. |
| 5,695,825 | A | | 12/1997 | Scruggs |
| 5,789,717 | A | | 8/1998 | Imaizumi et al. |
| 6,001,426 | A | | 12/1999 | Witherspoon et al. |
| 6,040,545 | A | | 3/2000 | Taki et al. |
| 6,071,323 | A | * | 6/2000 | Kawaguchi .................. 75/246 |
| 6,227,435 | B1 | | 5/2001 | Lazarz et al. |
| 6,337,453 | B1 | * | 1/2002 | Miller et al. ............. 219/56.21 |
| 6,346,177 | B2 | | 2/2002 | Leiphart |

(Continued)

FOREIGN PATENT DOCUMENTS

EP 1 350 861 A1 10/2003

(Continued)

OTHER PUBLICATIONS http://en.wikipedia.org/wiki/Recrystallization_%28metallurgical%29#Laws_of_Recrystallization [Accessed on Jul. 22, 2007].*

(Continued)

*Primary Examiner*—Rodney G McDonald
*Assistant Examiner*—Michael Band
(74) *Attorney, Agent, or Firm*—Janah & Associates, P.C.

(57) ABSTRACT

In a method of refurbishing a deposition target, a surface of the target is provided in a process zone. An electrical arc is generated in the process zone, and a consumable metal wire is inserted into the process zone to form liquefied metal. A pressurized gas is injected into the process zone to direct the liquefied metal toward the surface of the target to splatter the liquefied metal on the surface, thereby forming a coating having the metal on at least a portion of the surface of the target that exhibits reduced contamination from the environment.

34 Claims, 7 Drawing Sheets

U.S. PATENT DOCUMENTS

| | | | |
|---|---|---|---|
| 6,409,965 B1* | 6/2002 | Nagata et al. | 419/26 |
| 6,413,387 B1* | 7/2002 | Shi et al. | 204/192.38 |
| 6,518,086 B2* | 2/2003 | Beck et al. | 438/95 |
| 6,610,959 B2 | 8/2003 | Carlson et al. | |
| 6,635,219 B2* | 10/2003 | Wen et al. | 419/5 |
| 7,175,802 B2* | 2/2007 | Sandlin et al. | 419/8 |
| 7,192,335 B2* | 3/2007 | Lee et al. | 451/41 |
| 2002/0112955 A1* | 8/2002 | Aimone et al. | 204/298.12 |
| 2003/0077199 A1 | 4/2003 | Sandlin et al. | |
| 2003/0102207 A1* | 6/2003 | Wu et al. | 204/164 |
| 2004/0016635 A1* | 1/2004 | Ford et al. | 204/192.1 |
| 2004/0035698 A1 | 2/2004 | Ivanov et al. | |

FOREIGN PATENT DOCUMENTS

| | | |
|---|---|---|
| GB | 2155495 A | 9/1985 |
| JP | 1283367 | 11/1989 |
| JP | 2000265265 | 9/2000 |
| WO | WO-03062491 | 7/2003 |

OTHER PUBLICATIONS

Gene Mathers, Chapter 6: TIG welding, Welding of Aluminum and Its Alloys, 2002, pp. 97-115, Woodhead Publishing/CRC Press.

Gene Mathers, Chapter 7: MIG welding, Welding of Aluminum and Its Alloys, 2002, pp. 116-146, Woodhead Publishing/CRC Press.

Gene Mathers, Chapter 8: Other welding processes, Welding of Aluminum and Its Alloys, 2002, pp. 147-165, Woodhead Publishing/CRC Press.

Gene Mathers, Chapter 9: Resistance welding processes, Welding of Aluminum and Its Alloys, 2002, pp. 166-180, Woodhead Publishing/CRC Press.

Grant Ken-Hicken, Gas-Tungsten Arc Welding, 2002, Sandia National Laboratory, ASM International, website print-out from www.asminternational.org.

* cited by examiner

REFURBISHMENT OF SPUTTERING TARGETS

BACKGROUND

The present invention relates to the refurbishment of sputtering targets.

A sputtering chamber is used to sputter deposit material onto a substrate to manufacture electronic circuits, such as for example, integrated circuit chips and displays. Typically, the sputtering chamber comprises an enclosure wall that encloses a process zone into which a process gas is introduced, a gas energizer to energize the process gas, and an exhaust port to exhaust and control the pressure of the process gas in the chamber. The chamber is used to sputter deposit a material from a sputtering target onto the substrate. The sputtered material may be a metal, such as for example, aluminum, copper, tungsten, titanium, cobalt, nickel or tantalum. The sputtered material may also be a metal compound, such as for example tantalum nitride, tungsten nitride or titanium nitride. In the sputtering processes, the sputtering target is bombarded by energetic ions formed in the energized gas, causing material to be knocked off the target and deposited as a film on the substrate. The sputtering chamber can also comprise a magnetic field generator that shapes and confines a magnetic field about the target to improve sputtering of the target material.

In these sputtering processes, certain regions of the target are often sputtered at higher sputtering rates than other regions resulting in uneven sputtering of the target surface. Uneven target sputtering can arise from the complex contoured magnetic field maintained about the target to confine or stir energized gas ions about the target surface. Uneven sputtering can also be related to differences in grain size or structure of the target material, chamber geometry, and other factors. Uneven sputtering of the target forms sputtered depressions in the target such as pits, grooves, race-track like trenches, and other recesses, where material has been sputtered from the target at a higher rate than the surrounding areas. The development of these depressions can be undesirable because very deep features can penetrate the target to expose chamber components, such as backing plates, behind the target. Sputtering from the backing plate can contaminate the substrate being processed. Recessed features that are very large or very deep can also affect the deposition uniformity of sputtered material on the substrate.

Accordingly, unevenly sputtered targets are typically removed after processing of a predefined number of substrates and before the uneven sputtered depressions become too deep or wide. The sputtering target is then discarded, or more typically, re-used when the target material is expensive or has a high purity level that is difficult to obtain. For example, the target can be re-used by melting down the sputtered target material and shaping a new sputtering target. However, melting down and re-shaping the target is costly because it requires re-forming the entire target.

Several methods have also been developed to refurbish a sputtering target. In one method, the excessively sputtered regions of the target are filled with a powdered sputtering material and a laser or electron beam is directed onto the powdered material to melt and bonds the powdered material to the target, as for example, described in U.S. patent application No. 2002/0112955 to Aimone et al, filed on Feb. 14, 2002, which is herein incorporated by reference in its entirety. However, the laser or e-beam method requires expensive electron or laser beam sources and tracking or scanning equipment to follow the contour of the sputtered depression. Also, for certain materials, such as for example, high temperature refractory metals such as tantalum, the laser or e-beam source has to have an excessively high wattage that can cause re-crystallization or other changes in the regions of the target that are adjacent to the sputtered depression regions. Voids or bubbles can also form in the powdered material due to insufficient melting or when the molten material has a viscosity that is too high to fully penetrate the small scooped out regions within the sputtered depressions of the used target. Applying heat to the powdered material already filling the sputtered depressions can also cause the surface layer of powered material to melt before underlying layers are melted, resulting in subsequent out-gassing and a resultant pore structure in the filled depression.

Thus, it is desirable to have a method of refurbishing a partially sputtered used target to fill in sputtered depression features formed in the target. It is also desirable to refurbish the eroded regions without damaging or otherwise altering the crystal structure of adjacent regions of the target. It is further desirable to have a method of refurbishing a target that is not excessively costly and that can efficiently refurbish targets.

SUMMARY

In one version of a method of refurbishing a deposition target, a surface of the target is provided in a process zone. An electrical arc is generated in the process zone, and a consumable metal wire is inserted into the process zone to form liquefied metal. A pressurized gas is injected into the process zone to direct the liquefied metal toward the surface of the target to splatter the liquefied metal on the surface, thereby forming a coating having the metal on at least a portion of the surface of the target that exhibits reduced contamination from the environment.

In another version of a method of refurbishing a deposition target, the surface of the target is provided in a process zone, and an electrical arc is generated in the process zone between first and second electrodes by applying a voltage to the electrodes. At least one of the first and second electrodes has a consumable metal wire which is least partially liquefied to form liquefied metal. A pressurized gas is injected into the process zone to direct the liquefied metal toward the surface of the target to splatter the liquefied metal on the surface, thereby forming a coating having the metal on at least a portion of the surface of the target that exhibits reduced contamination from the environment.

In another version of a method of refurbishing a deposition target, the surface of the target is provided in a process zone, and an electrical arc is generated in the process zone between the surface of the target and a consumable metal wire by applying a voltage to the target and the consumable metal wire, thereby at least partially liquefying the consumable metal wire in the process zone to form a liquefied metal. A pressurized gas is injected into the process zone to direct the liquefied metal toward the surface of the target to splatter the liquefied metal on the surface, thereby forming a coating having the metal on at least a portion of the surface of the target that exhibits reduced contamination from the environment.

In yet another version of a method of refurbishing a deposition target, the surface of the target is provided in a process zone and an electrical arc is generated in the process zone between the surface of the target and an electrode by applying a voltage to the target and the electrode. A consumable metal wire is inserted into the process zone to at least partially liquefy the consumable metal wire in the process zone to form liquefied metal. A pressurized gas is injected into the process zone to direct the liquefied metal toward the surface of the target to splatter the liquefied metal on the surface, thereby forming a coating having the metal on at least a portion of the surface of the target that exhibits reduced contamination from the environment.

In yet another version of a method of refurbishing a deposition target, a surface of the deposition target is provided in a process zone, and an electrical arc is generated in the process zone between the surface of the sputtering target and an electrode by applying a voltage to the target and the electrode. The electrical arc is passed through a nozzle to form a plasma jet in the process zone. A consumable metal wire is inserted into the process zone to at least partially liquefy the consumable metal wire in the process zone to form liquefied metal that is directed onto the surface of the sputtering target by the plasma jet to splatter the surface with the liquefied metal, thereby forming a coating having the metal on at least a portion of the surface of the target. A pressurized gas is injected into the process zone to reduce contamination of the liquefied metal from the environment.

In another version of a method of refurbishing a deposition target, a surface of the deposition target is provided in a process zone. A pressurized gas is injected into the process zone and the pressurized gas is ignited to combust the pressurized gas. A consumable metal wire is inserted into the process zone to at least partially liquefy the consumable metal wire to form liquefied metal that is directed onto the surface of the target by the pressurized gas to splatter the surface of the target with the liquefied metal, thereby forming a coating having the metal on at least a portion of the surface of the target.

In yet another version of a method of refurbishing a deposition target, a metal-containing body is placed on at least a portion of a surface of the target. A pressure is applied that presses the metal-containing body against the surface, and an electrical current is passed though the metal-containing body and the surface of the target to at least partially melt and fuse the metal-containing body to the portion of the surface of the target.

In a further version of a method of refurbishing a deposition target, a surface of a metal-containing body is contacted with at least a portion of a surface of the target. The surface of the metal-containing body is rubbed against the surface of the target to generate a frictional force between the surfaces that heats and at least partially melts the metal-containing body to fuse the metal-containing body to the surface of the target.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1A:
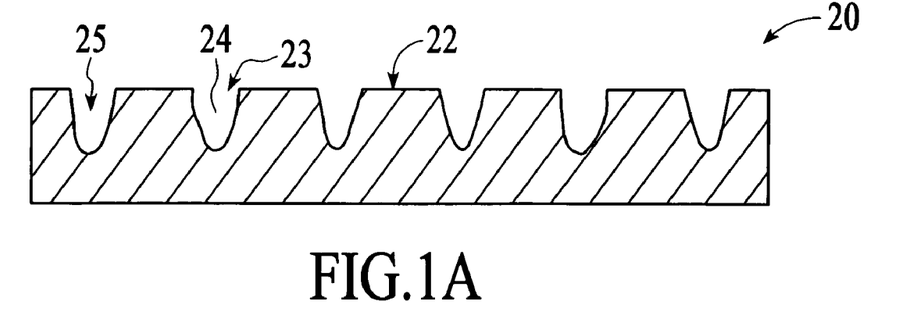
FIG. 1a is a schematic side view of an embodiment of a deposition target having a pre-sputtered surface with sputtering depressions formed therein.

An embodiment of a target 20 capable of depositing material on a substrate is shown in FIG. 1a. The material can comprise a metal, such as for example at least one of titanium, aluminum, tantalum, tungsten, and copper, and can also comprise metals such as at least one of germanium, selenium and tellurium. The target 20 has a surface 22 from which material has been removed to deposit the material on the substrate. For example, the surface 22 can comprise a pre-sputtered surface that has been sputtered by energized gas ions to remove sputtering material from the surface 22. The surface 22 of the target can also have been used to deposit material on a substrate by another method. For example, an electromagnetic energy beam, such as a laser or electron beam, can be directed onto the surface to break material away from the surface 22.

In the version, the surface 22 comprises a pre-sputtered surface having one or more sputtered portions 23 that form as a result of the sputtering of material from that portion 23 of the surface 22. In one version, the pre-sputtered surface 22 comprises a sputtered depression 24 that is formed in the surface 22 as the result of, for example, uneven sputtering rates across the pre-sputtered surface 22. In one version, the sputtering depressions 24 can be grooves having multiple concentric rings 25, centered about the middle of the target 20. The target 20 can comprise from about 1 to about 6 of the rings 25, and the rings 25 can comprise depths in the target 20 of up to about 5 cm, and can also comprise a width at the top of the ring of up to about 7.5 cm.

A refurbishment process can be performed to refurbish the pre-sputtered surface 22 of the target 20 and provide a fresh sputtering surface 22. In one version, an improved refurbishment process comprises an electrical arc generating refurbishment process. In the electrical arc generating refurbishment process, a portion 23 of the pre-sputtered surface of the target 20 is placed in a process zone 35, as shown for example in FIGS. 2 and 3. An electrical arc 34 is generated in the process zone 35, and a consumable metal wire is inserted into the process zone 35 to at least partially liquefy the consumable metal wire in the process zone 35 to form a liquefied metal. The process zone 35 can comprise a region that is about the electrical arc 34, such as for example, a few centimeters about the electrical arc. A pressurized gas is injected into the process zone 35 to direct the liquefied metal onto the pre-sputtered surface 22 of the sputtering target 20, which splatters the pre-sputtered surface with the liquefied metal. The pressurized gas also reduces contamination of the liquefied metal from the environment. The splattered metal replaces sputtering material that has been sputtered away from the target 20 during processing.

Figure 1B:
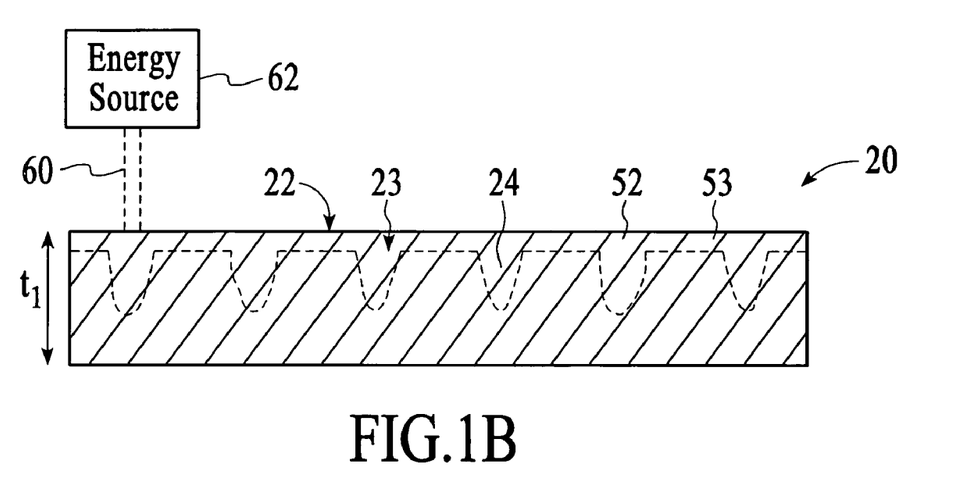
FIG. 1b is a schematic side view of an embodiment of a deposition target after a refurbishment step.
Figure 1C:
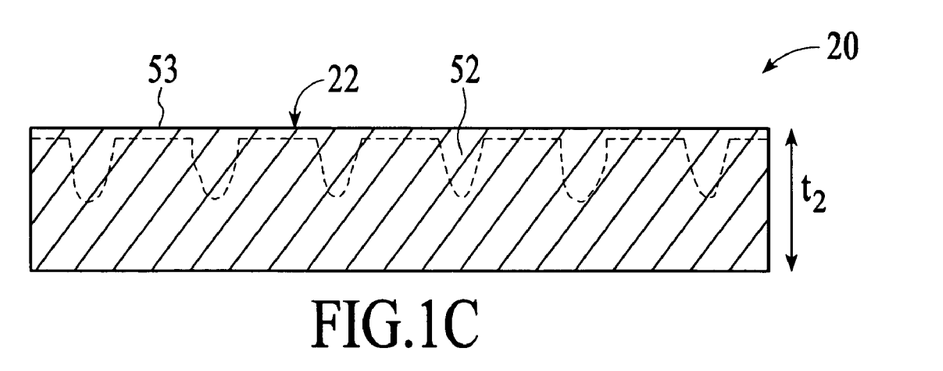
FIG. 1c is a schematic side view of an embodiment of a deposition target after machining of the target surface.

The refurbishment process can be performed to form splattered metal material 52 on the pre-sputtered surface 22, and can even form a fresh coating 53 of splattered metal material 52 on at least a portion of the pre-sputtered surface 22 of the target 20, as shown in FIGS. 1*b* and 1*c*. The coating 53 of deposited metal material can even extend across substantially the entire surface 22 of the target 20. The refurbishment process can also at least partially fill one or more depressions 24 with the metal, and can even substantially entirely fill all of the depressions 24 formed in the surface 22. FIGS. 1*b* and 1*c* show re-furbished targets 20 having depressions 24 that have been filled with deposited metal 52 to form a coating 53 of the deposited metal 52 at the surface 22 of the target 23, where the dotted lines indicate the boundaries of the depressions 24 and target surface before the refurbishment process. The electrical arc method provides an efficient method of refurbishing a pre-sputtered surface 22 with high-purity metal that is cost-effective as well as flexible in terms of the refurbishment of targets 20 having a range of materials and different shapes and sizes of pre-sputtered surfaces.

Figure 2:
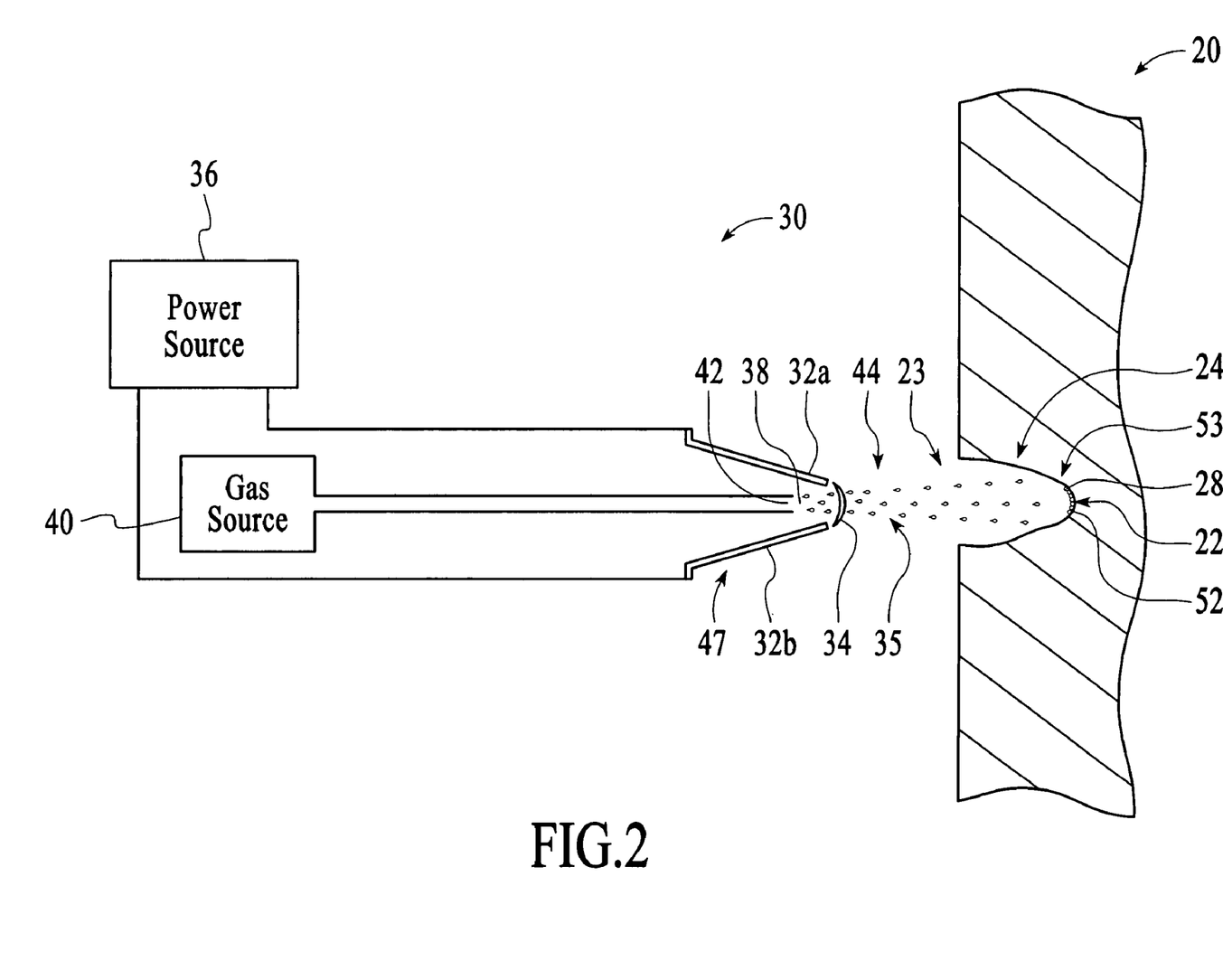
FIG. 2 is a schematic view of an embodiment of an electrical arc generating sprayer.

In one version of an electrical arc refurbishment process, the electrical arc is generated in a process zone 35 between first and second electrodes 32*a,b* positioned above the pre-sputtered surface 22 of the target 20. An embodiment of an electrical arc generating sprayer 30 having first and second electrodes 32*a,b* is shown in FIG. 2. The first and second electrodes 32*a,b* can be angled towards each other to allow for formation of the electrical arc 34 near the closest point between the electrodes 32*a,b*. A voltage is applied to the electrodes 32*a,b* via a power source 36 at a power level that is sufficiently high to generate the electrical arc 34 in the process zone 35. The electrical arcing process zone 35 is capable of at least partially liquefying and atomizing metal in the vicinity of the arc 34 so the metal can be splattered onto the pre-sputtered surface 22.

A pressurized carrier gas 38 is injected into the electrical process zone 35 to direct liquefied metal onto the surface 22 of the target 20, such as in a sputtered depression 24. The pressurized carrier gas 38 can also reduce contamination of the liquefied metal by the surrounding environment, and can help sustain the electrical arc 34 in the process zone 35. The carrier gas 38 can comprise, for example, at least one of air, nitrogen, argon, and helium and preferably comprises an inert gas such as at least one of argon and helium. The carrier gas 38 can be supplied by a gas source 40 that is connected to a gas outlet 42 positioned in the vicinity of the electrical process zone 35. In the version shown in FIG. 2, the pressurized carrier gas is flowed between the electrodes 32*a,b* and through the process zone 35 to direct the liquefied metal. The liquefied metal particles 44 propelled by the carrier gas 38 impinges and splatters on the surface 22 of the target 20, such as at the bottom 28 of a depression 24, where the metal particles cool and condense to form solidified sputtering target material.

A consumable metal wire 47 is inserted into the process zone 35 to provide a source of the metal sputtering material. The consumable metal wire 47 can comprise a cylindrical shape or other shape, such as a strip of metal, and comprises a desired sputtering material. The electrical arcing process zone 35 at least partially atomizes and liquefies the metal of the consumable wire 47, while the carrier gas 38 propels the liquefied particles away from the wire 47 and towards the pre-sputtered surface 22 of the target 20 to splatter the metal on the pre-sputtered surface 22. In one version, at least one of the electrodes 32*a,b* is a consumable electrode comprising the consumable metal wire 47, as shown for example in FIG. 2. For example, the electrical arc generating sprayer 30 can comprise a twin wire arc sprayer having first and second electrodes 32*a,b*, that are both consumable electrodes, as described for example in U.S. Pat. No. 6,227,435 B1, issued on May 8$^{th}$, 2001 to Lazarz et al, and U.S. Pat. No. 5,695,825 issued on Dec. 9$^{th}$ 1997 to Scruggs, both of which are incorporated herein by reference in their entireties. The electrical arc generating sprayer 30 can also comprise a single wire arc sprayer having one consumable electrode and one non-consumable electrode, as described for example in U.S. Pat. No. 6,610,959 to Carlson et al, issued on Aug. 26, 2003, which is herein incorporated by reference in its entirety. Also, a separate consumable metal wire 47 that does not serve as an electrode can be inserted into the electrical process zone 35 to provide a source of the metal (not shown.) The consumable metal wire 47 can be continuously fed into the process zone 35 to provide a continuous source of metal.

Figure 3:
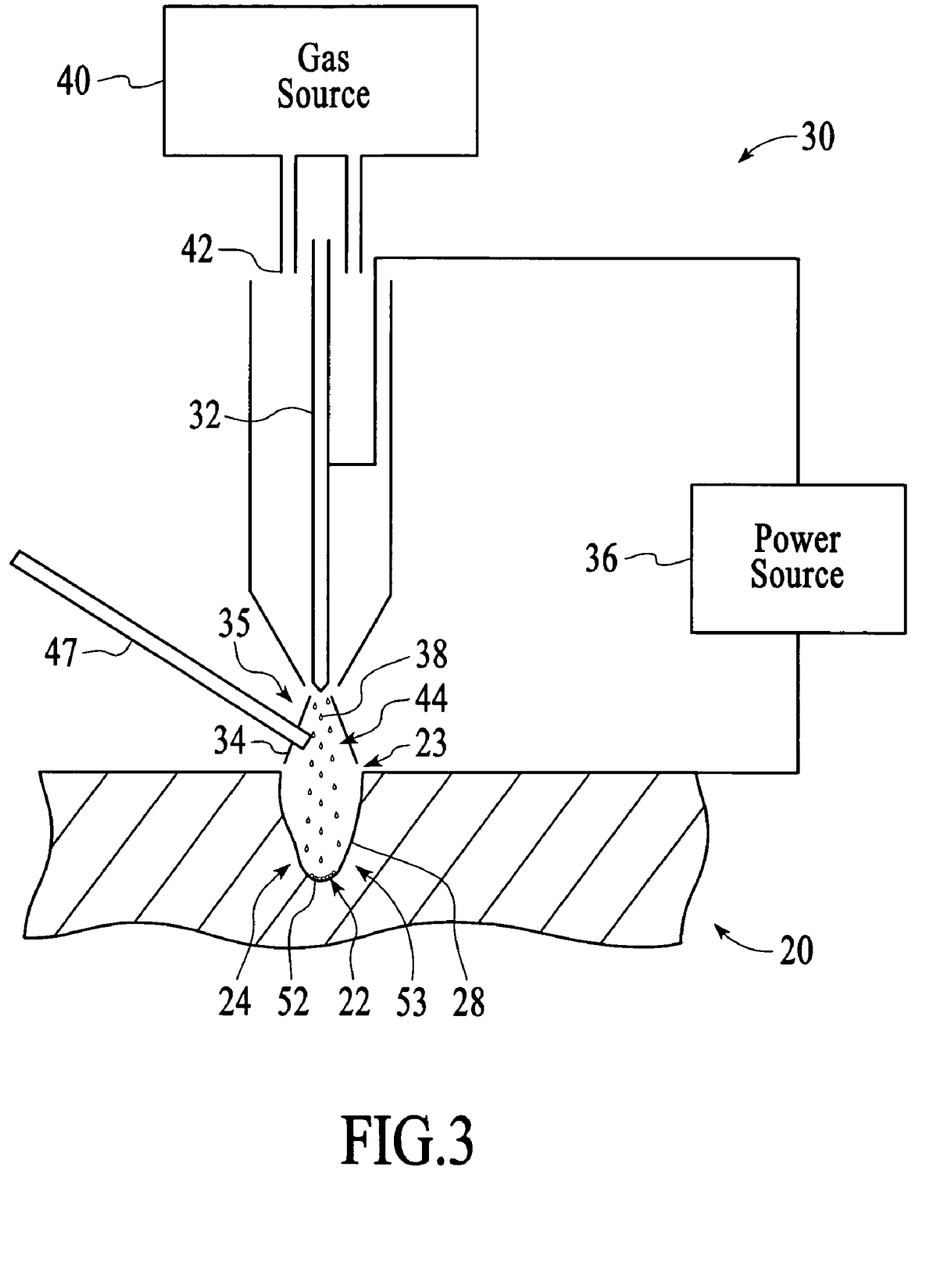
FIG. 3 is a schematic view of another embodiment of an electrical arc generating sprayer.

In another version, the electrical arc 34 is formed in a process zone 35 between an electrode 32 and the pre-sputtered surface 22 of the target 20. An embodiment of an electrical arc generating sprayer 30 that forms such an electrical arc is shown in FIG. 3. The electrical arc 34 is formed by applying a voltage to the electrode 32 and the target 20 via a power source 36, at a power level that is sufficiently high to at least partially liquefy and atomize a metal in the vicinity of the arc 34. A pressurized carrier gas 38 is injected into the process zone 35 to direct the liquefied metal 44 towards the target surface 22, and can be supplied by a gas source 40 connected to an outlet 42. The pressurized carrier gas 38 preferable comprises an inert gas, such as for example at least one of argon and helium, and can reduce contamination of the liquefied metal as well as sustain the electrical arc 34. The liquefied material 44 directed by the carrier gas 38 splatters onto the pre-sputtered surface 22 of the target 20, such as at the bottom 28 of a depression 24, and condenses into the solidified sputtering target material. Also, to inhibit melting of the pre-sputtered surface 22 of the target 30 by the electrical process zone 35, the pre-sputtered surface 22 of the target 20 may be cooled to a suitable temperature. For example, the pre-sputtered surface 22 may be cooled to a temperature below the melting point of the surface material, such as for example to a temperature below about 3000° C., and even below about 1000° C. For example, the surface 22 may be cooled to a temperature below about 660° C. for a surface 22 comprising aluminum, and may even be cooled to a temperature below about 100° C.

In one version, the electrode 32 that generates the arc 34 in the process zone 35 between itself and the target surface 22 comprises a consumable metal wire 47 having the desired metal sputtering material. An example of a process having such a consumable wire is a metal inert gas shielded process (MIG), as described for example in *Welding of Aluminum and Its Alloys* by Gene Mathers, published in 2002 by Woodhead Publishing/CRC Press, which is herein incorporated by reference in its entirety. In another version, the electrode 32 comprises a non-consumable electrode having a high-melting point material, such as for example tungsten, and a separate consumable metal wire 47 is provided in the process zone 35 to provide a source of the metal, as shown for example in FIG. 3. An example of an electrical arc method having a non-consumable electrode is a gas-tungsten arc welding process (GTAW), also called a tungsten inert gas welding process (TIG) as described for example in U.S. Pat. No. 6,040,545 to Taki et al, issued on Mar. 21, 2001, and U.S. Pat. No. 5,789, 717 to Imaizumi et al, issued on Aug. 4, 1998, both of which are herein incorporated by reference in their entireties.

In another version, an electrical arc 34 formed between the electrode 32 and the target surface 22 is passed through a nozzle 46 that constricts the arc 34 to form a plasma jet 48 in the process zone 35. The plasma jet 48 provides a constricted plasma column that yields improved control over deposition of metal material onto the surface 22. An example of such an electrical arc generating method is a plasma-arc welding method, such as a plasma-TIG or plasma-MIG method, as described for example in *Welding of Aluminum and Its Alloys* by Gene Mathers, published in 2002 by Woodhead Publishing/CRC Press, Chapter 8, which is herein incorporated by reference in its entirety. In one version, the liquefied metal that is splattered onto the surface 22 is provided by a consumable electrode 32 that comprises the metal material. In another version, the liquefied metal is provided as a separate consumable metal wire 47 that is inserted into the process zone 35, as shown for example in FIG. 4.

Figure 4:
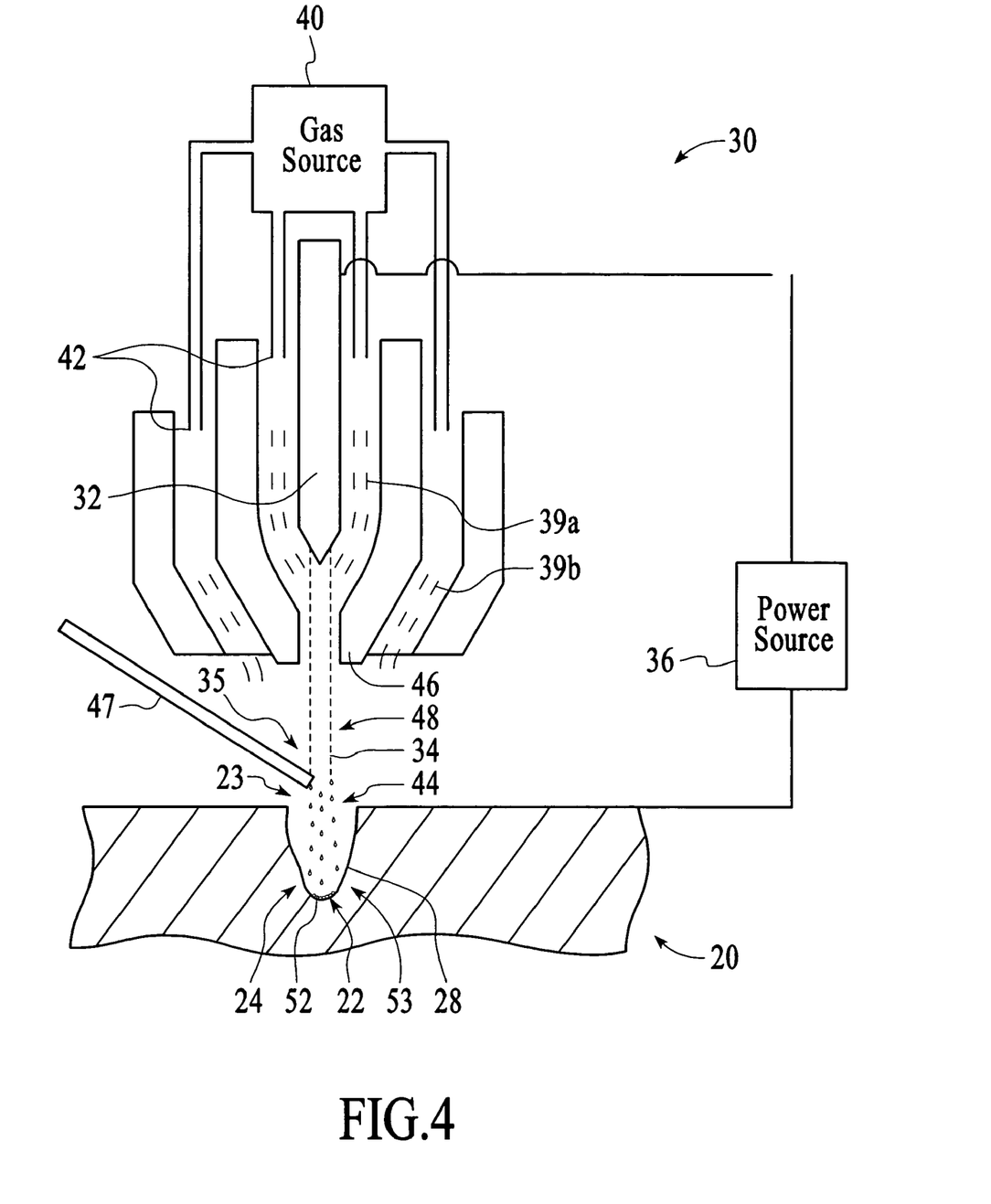
FIG. 4 is a schematic view of yet another embodiment of an electrical arc generating sprayer.

An embodiment of an electrical arc generating sprayer 30 comprising a constricting nozzle 46 is shown in FIG. 4. In this embodiment, an electrical arc 34 is formed between the electrode 32 and target surface 22 by applying a voltage that is sufficiently high from a power source 36. A first stream 39a of a pressurized gas is passed adjacent to an electrode 32 and injected into the process zone 35 to assist in striking and sustaining the electrical arc 34 between the electrode 32 and target surface 22. The carrier gas preferably comprises an inert gas, such as for example at least one of argon and helium. The electrical arc 34 is passed through a nozzle 46 above the surface 22 which is sized to constrict the electrical arc 34 and form a high energy jet 48 comprising a plasma of the pressurized gas. The plasma jet 48 is capable of at least partially liquefying metal in the process zone 35, and directing the liquefied metal onto the surface 22 of the target to splatter the surface 22 with the metal, thereby forming a coating 53 comprising the metal on at least a portion of the surface 22, such as for example, at the bottom 28 of a depression 24. A second stream 39b of pressurized gas can also be injected into the process zone 35, for example, at a region downstream of the nozzle 46, to further direct the liquefied metal onto the surface 22 and to reduce contamination of the liquefied metal 44 by the environment.

Figure 5:
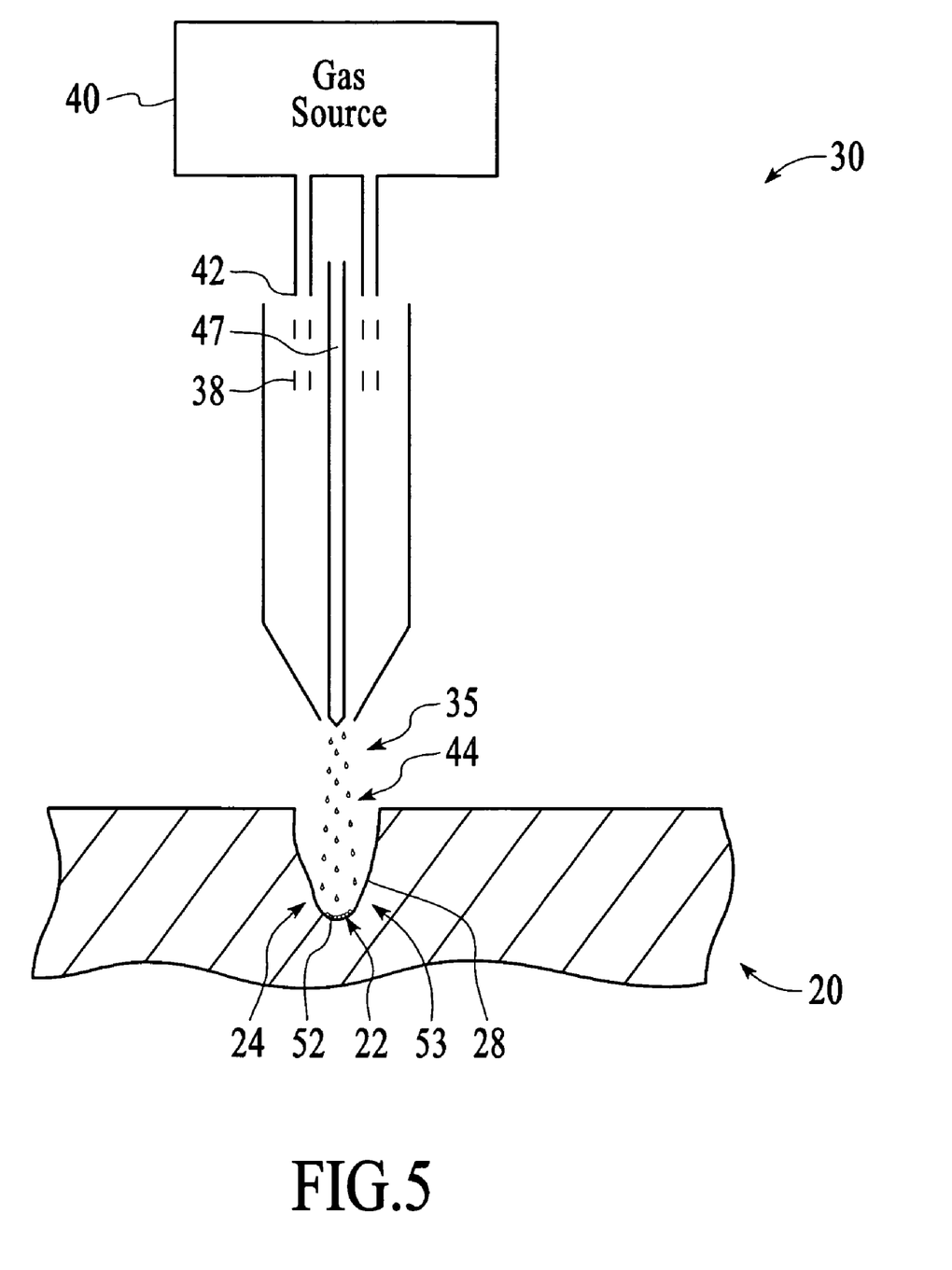
FIG. 5 is a schematic side view of an embodiment of a flame sprayer.

In yet another method of refurbishing a target 20, a coating 53 of deposited metal 52 can be formed by a flame spray method that includes igniting a pressurized carrier gas in a process zone 35 to at least partially liquefy a metal material in the process zone 35. An embodiment of a flame sprayer 30 capable of igniting a pressurized carrier gas to deposit material on a target surface 20 is shown in FIG. 5. In this embodiment, a pressurized carrier gas 28 is injected into the process zone 35 above the surface 22 of the target 20. The process zone 35 comprises an area about the sprayer 30 and target surface 22 where heated gases from a combustion process can at least partially melt metal material to form liquefied metal and deposit the material on the surface 20. The pressurized carrier gas can be provided by a gas source 40 via a gas inlet 42, and preferably comprises a combustible gas, such as for example, at least one of oxygen, acetylene, propane and propylene. A source of metal, such as a consumable metal wire 47, is also inserted in the process zone 35. Alternatively, the source of metal can comprise a metal powder or other metal composition. The pressurized carrier gas 38 in ignited to burn the carrier gas 38, generating heat which at least partially liquefies the consumable metal wire 47. The liquefied metal 44 is directed by the pressurized carrier gas 38 onto the surface 22 of the target 20 to form a coating 53 comprising metal on at least a portion of the surface 22.

The consumable metal wire 47, provided separately or as a part of a consumable electrode 32, comprises a composition that is suitable for forming the desired target material. For example, the consumable metal wire 47 can comprise at least one of titanium, aluminum, tantalum, copper and tungsten. The consumable metal wire 47 can also comprise a plurality of metals, such as metal alloy that can be deposited on the pre-sputtered surface 22 to form a coating 53 comprising the plurality of metals. A plurality of metals may be desirable to provide the desirable electrical or other characteristics of metal layers deposited on a substrate 104. In one version, the consumable metal wire 47 comprises an alloy having a combination of aluminum and least one of copper and silicon. The consumable metal wire 47 comprising the alloy can be at least partially liquefied in the process zone 35 to form a coating 53 comprising the alloy components in substantially the same relative amounts on the surface 22 of the target 20. A suitable consumable metal wire 47 can comprise an aluminum alloy having from about 0.25% to about 20% by weight of copper, such as about 0.5% by weight of copper. The consumable metal wire 47 comprising the aluminum alloy can form a coating 53 comprising substantially the same relative amounts of the alloy components on the surface 22. A suitable amount of silicon for a consumable metal wire 47 may be from about 0.25% to about 20% by weight of silicon, such as about 1% by weight of silicon. In another version, the coating 53 can be formed by a consumable metal wire 47 comprising a copper alloy having aluminum, such as for example, a coating 53 comprising copper and having about 0.25% to about 20% by weight of aluminum.

In yet another version, the consumable metal wire 47 comprises a chalcogen metal, which is defined as a metal belonging to Group VI of the periodic table, and includes selenium, tellurium and polonium metals. The consumable metal wire 47 can also comprise a chalcogenide alloy, which is an alloy comprising at least one chalcogen metal. In one version, the chalcogenide alloy comprises a chalcogenide phase change material, which is a material that is capable of undergoing a thermally activated change in phase, for example, for data storage. A suitable chalcogenide alloy for the consumable metal wire 47 may be an alloy comprising, for example, at least one of selenium (Se), tellurium (Te) and the metal germanium (Ge), such as a $Ge_xSe_yTe_z$ alloy having from about 1% to about 99% by weight of Ge, from about 1% to about 99% by weight of Se, and from about 1% to about 99% by weight of Te. The consumable metal wire 47 comprising the chalcogenide alloy can be at least partially liquefied in the process zone 35 to form a coating 53 comprising the chalogenide alloy components on the surface 22 of the target 20.

Figure 6:
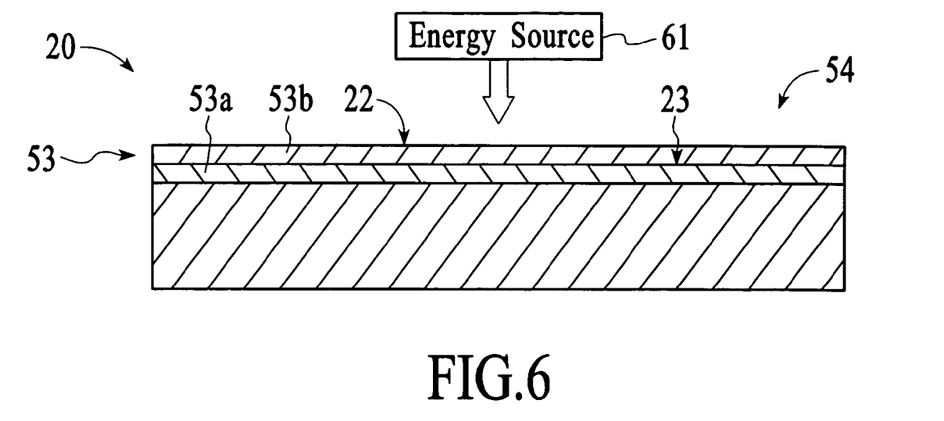
FIG. 6 is a schematic side view of an embodiment of a deposition target having first and second deposited layers.

In another version, an electrical arcing method can form a coating 53 comprising a plurality of metals by depositing a plurality of metal layers 53a,b comprising different metal materials on the surface 22. For example, as shown in FIG. 6, a first liquefied metal can be directed onto the surface 23 to form a first layer 53a comprising the first metal. A second liquefied metal can be directed onto the first layer 53a to form a second metal layer 53b comprising the second metal material over the first layer 53a. For example, the first layer 53a can comprise aluminum and the second layer 53b can comprise at least one of copper and silicon. As another example, at least one of the first and second layers 53a,b can comprise a chalcogen metal. One or more subsequent layers of metal material can also be deposited over the first and second layers 53a,b. The first and second layers 53a,b can then be exposed to an energy source 61 to interdiffuse the first and second metals between the layers 53a,b to form a coating 53 comprising an interdiffused layer 54 comprising both the first and second metals. The interdiffused layer 54 may comprise, for example, an aluminum interdiffused layer comprising at least one of copper and silicon, such as an aluminum alloy. The interdiffused layer 54 can also comprise a chalcogenide interdiffused layer, such as a chalcogenide alloy comprising $Ge_xSe_yTe_z$. In one version, the energy source 61 can comprise a source capable of heating the layers 53a,b to a temperature sufficiently high to interdiffuse the layers 53a,b. A suitable heating temperature may be at least about 50° C., such as from about 50° C. to about 3000° C., and even from about 50° C. to about 1000° C.

The heating temperature and thickness of the first and second layers 53a,b are selected to provide an interdiffused layer 54 having a desired composition. For example, to form an interdiffused layer 54 comprising an alloy of aluminum and copper, a suitable heating temperature may be from about 50° C. to about 660° C. A thickness of a first layer 53a comprising aluminum may be from about 100 angstroms to about 10 micrometers, and a thickness of a second layer 53b comprising at least one of copper and silicon may be from about 5 angstroms to about 2 micrometers. The interdiffused layer 54 can comprise an aluminum alloy having at least one of (i) from about 0.25% to about 20% by weight of copper, and (ii) from about 0.25% to about 20% by weight of silicon.

Figure 7:
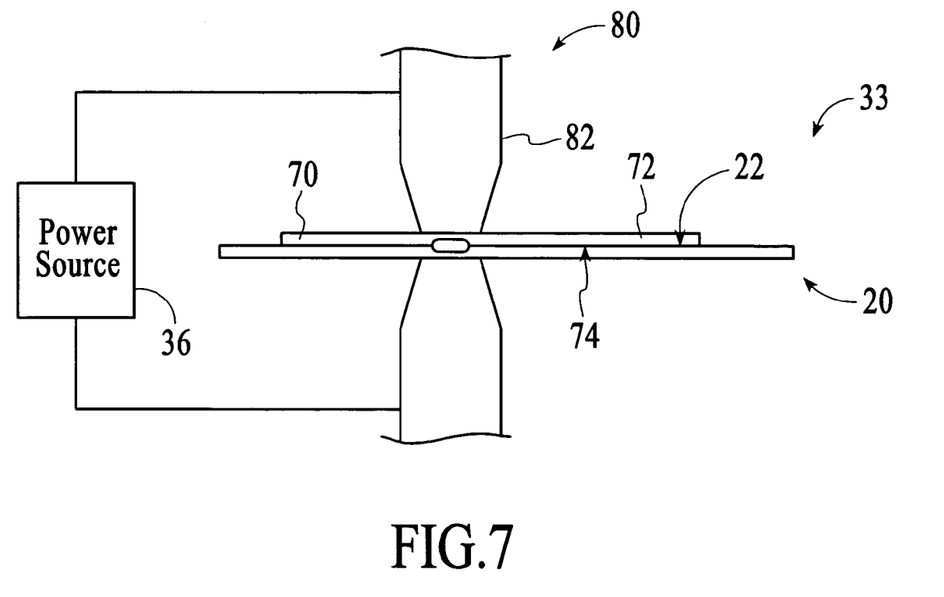
FIG. 7 is a schematic side view of an embodiment of a resistance welder.

In yet another version of a method to refurbish a target 20, a resistance welding process can be performed to fuse a metal-containing body 70 onto the surface 22 of the target 20. An example of a resistance welding process is described, for example, in Chapter 9 of Welding of Aluminum and Its Alloys by Gene Mathers, published in 2002 by Woodhead Publishing/CRC Press, which is herein incorporated by reference in its entirety. In an example of a resistant welding method, as shown in FIG. 7, a metal-containing body 70 is placed on at least a portion of the surface 22 of the target 20. A pressure is then applied to press the metal-containing body 70 against the target surface 22. For example, the metal-containing body 70 and target surface 22 can be pressed together by a resistance welder 80 having clamping arms 82. An electrical current is generated by a power source 36, and is passed through the metal-containing body 70 and target surface 20, for example via the clamping arms. The electrical current is sufficiently high to resistively heat and at least partially melt and fuse the metal-containing body 70 to the portion of the target surface 22, thereby replacing material that had been removed from the portion of the surface 22, for example, by sputtering.

In yet another version of a method of refurbishing the surface 22 of a target 20, a friction welding method is used to fuse a metal-containing body 70 to at least a portion of the surface 22 of the target 20. An example of a friction welding method is described in Chapter 8 of Welding of Aluminum and Its Alloys by Gene Mathers, published in 2002 by Woodhead Publishing/CRC Press, which is herein incorporated by reference in its entirety. In a friction welding process, a surface 74 of a metal-containing body 70 is contacted with at least a portion of the surface 22 of the target 20. A frictional force is generated between the surface 74 of the metal-containing body and the surface 22 of the target 20 by rubbing the surfaces 74,22 against each other. For example, the metal-containing body 70 and target 20 can be held by clamping arms 82 that are capable of holding and rotating at least one of the metal-containing body 70 and target 20 against each other. The frictional force generated by the surfaces 74,22 heats and at least partially melts the metal-containing body 70 to fuse the metal-containing body 70 to the surface 22 of the target 20.

The metal-containing body 70 can comprise a shape that is suitable to refurbish the target surface 20. For example, the metal-containing body 70 can comprise a layer 72 of material, as shown in FIG. 7, and can also comprise a shape that is suitable to fit a sputtered depression 24, such as a groove, in the target 20. The metal-containing body 70 can comprise target material comprising one or a plurality of metals, such as for example at least one of titanium, tungsten, tantalum and copper, and even at least one of germanium, selenium and tellurium. The metal-containing body 70 can also comprise a metal alloy, such as an alloy of aluminum having at least one of copper and silicon, and can also comprise a chalcogenide alloy. Also, a plurality of metal-containing bodies 70 comprising layers 72 of metal can layered on top of one another on the surface 20, and welded to form an interdiffused layer comprising the target material on the surface 20.

Once the target surface 22 has been refurbished with the deposited metal 52, as shown for example in FIG. 1b, a treatment step can be performed to prepare the target 20 for use in the sputtering chamber 106. For example, the surface 22 of the target comprising the freshly-deposited coating 53 can be exposed to an energy source 62 to re-crystallize the metal material and provide a uniform sputtering surface 22. The energy source 62 may be capable of heat treating the target material, for example by heating the target material to a temperature that is sufficiently high to re-orient misaligned crystals. The heat treating temperature may also desirably be kept below the melting point of the surface material. A suitable heat treatment temperature for the target 20 may be, for example, at least about 50° C. and even at least about 1000° C., such as from about 50° C. to about 3000° C., and even from about 50° C. to about 1000° C. For example, a suitable heat treatment temperature for a target comprising aluminum sputtering material may be from about 50° C. to about 660° C., such as from about 100° C. to about 200° C. The heat treatment step provides a more uniform surface 22 that improves the deposition of uniform layers on the substrates 104.

In one version, the heat treatment step comprises heating the target 20 by directing heating radiation onto the surface 22 of the target 20, for example via overhead heating lamps. The target 20 can also be heated by placing a heater such as a resistive heater adjacent to the target, or by placing the target in a heating furnace. In another version, the heat treatment step comprises directing an electromagnetic energy beam 60, such as for example a laser beam, at the deposited metal 52 on the target surface 22, as shown for example in FIG. 1b. The electromagnetic energy beam 60 rapidly heats the deposited material 52 to re-orient the crystal structures in the material. The electromagnetic energy beam 60 can be scanned across the surface 22 of the target 20 to provide the heat treatment in the desired areas.

A desired thickness of the target 20 can be obtained by machining the surface 22 of the target 20 to obtain a predetermined thickness of the target sputtering material that provides optimum processing results. For example, FIG. 1b shows an embodiment of a target 20 having sputtering material with a thickness $t_1$. FIG. 1c shows an embodiment of a target 20 after the surface 22 has been machined to reduce the thickness of the target sputtering material to a desired thickness $t_2$ that is smaller than $t_1$. The thickness of the target 20 can also be reduced by other methods to achieve a predetermined target thickness, such as for example, by chemically etching away a thickness of the target 20. In one version, the surface 22 of the target 20 is machined down to provide a desired thickness after a heat treatment step that re-crystallizes the target material. The surface 22 of the target 20 can also or alternatively be machined before a heat treatment step is performed. The surface 22 of the target 20 can be cleaned in a cleaning step that removes any residues remaining from one or more of the heat treatment and machining steps. For example, the surface 22 can be cleaned by rinsing the surface 20 with a cleaning solvent, such as a solvent comprising isropropyl alcohol.

Figure 8:
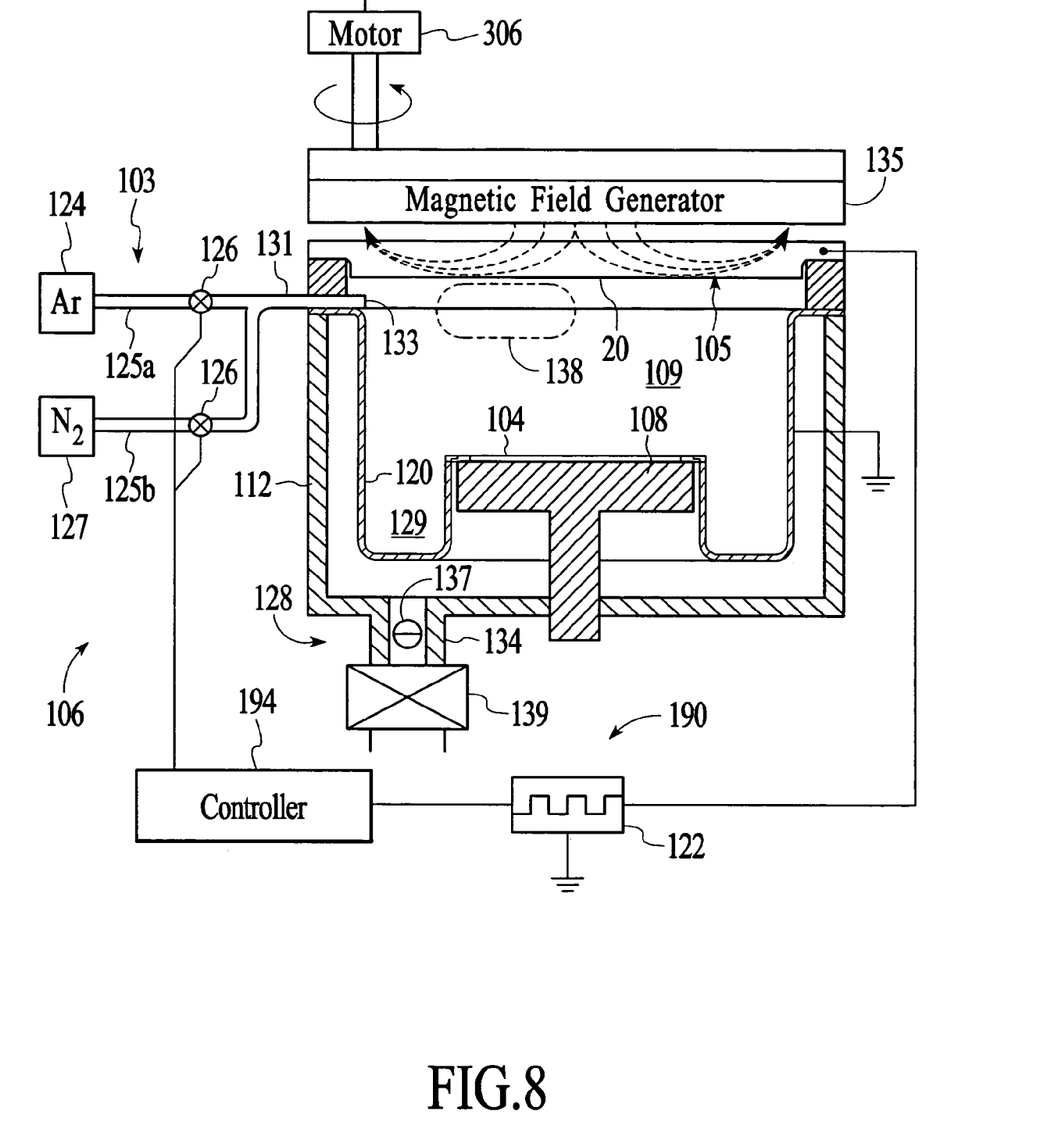
FIG. 8 is a sectional side view of an embodiment of a sputter deposition chamber having a refurbished target.

The target 20 can be used in a sputtering chamber, an embodiment of which is shown in FIG. 8, to sputter deposit a layer such as one or more of tantalum, tantalum nitride, aluminum, aluminum nitride, titanium, titanium nitride, tungsten, tungsten nitride and copper, on the substrate 104. A substrate support 108 is provided for supporting the substrate 104 in the chamber 106. The substrate 104 is introduced into the chamber 106 through a substrate loading inlet (not shown) in a sidewall of the chamber 106 and placed on the support 108. The support 108 can be lifted or lowered by support lift bellows (not shown) and a lift finger assembly (also not shown) can be used to lift and lower the substrate 104 onto the support 108 during transport of the substrate 104 into and out of the chamber 106.

A sputtering gas supply 103 introduces sputtering gas into the chamber 106 to maintain the sputtering gas at a sub atmospheric pressure in the process zone 109. The sputtering gas is introduced into the chamber 106 through a gas inlet 133 that is connected via the gas inputs 125$a,b$ to one or more gas sources 124, 127, respectively. One or more mass flow controllers 126 are used to control the flow rate of the individual gases—which may be premixed in a mixing manifold 131 prior to their introduction into the chamber 106 or which may be separately introduced into the chamber 106. The sputtering gas typically includes a non-reactive gas, such as argon or xenon, that when energized into a plasma, energetically impinges upon and bombards the target 20 to sputter material, such as copper, titanium, titanium nitride, aluminum, tantalum, or tantalum nitride, off from the target 20. The sputtering gas may also comprise a reactive gas, such as nitrogen. Also, other compositions of sputtering gas that include other reactive gases or other types of non-reactive gases, may be used as would be apparent to one of ordinary skill in the art.

An exhaust system 128 controls the pressure of the sputtering gas in the chamber 106 and exhausts excess gas and by-product gases from the chamber 106. The exhaust system 128 comprises an exhaust port 129 in the chamber 106 that is connected to an exhaust line 134 that leads to one or more exhaust pumps 139. A throttle valve 137 in the exhaust line 134 may be used to control the pressure of the sputtering gas in the chamber 106. Typically, the pressure of the sputtering gas in the chamber 106 is set to sub-atmospheric levels.

The sputtering chamber 106 comprises a sputtering target 20 that facing the substrate 104 to deposit material on the substrate 104. The sputtering chamber 106 may also have a shield 120 to protect a wall 112 of the chamber 106 from sputtered material, and which may also serve as grounding plane. The target 20 can be electrically isolated from the chamber 106 and is connected to a power source 122, such as a DC or RF power source. In one version, the power source 122, target 20, and shield 120 operate as a gas energizer 190 that is capable of energizing the sputtering gas to sputter material from the target 20. The power source 122 can electrically bias the target 20 relative to the shield 120 to energize the sputtering gas in the chamber 106 to form a plasma that sputters material from the target 20. The material sputtered from the target 20 by the plasma is deposited on the substrate 104 and may also react with gas components of the plasma to form a deposition layer on the substrate 104.

The chamber 106 can further comprise a magnetic field generator 135 that generates a magnetic field 105 near the target 20 to increase an ion density in a high-density plasma region 138 adjacent to the target 20 to improve the sputtering of the target material. In addition, an improved magnetic field generator 135 may be used to allow sustained self-sputtering of copper or sputtering of aluminum, titanium, or other metals; while minimizing the need for non-reactive gases for target bombardment purposes, as for example, described in U.S. Pat. No. 6,183,614 to Fu, entitled "Rotating Sputter Magnetron Assembly"; and U.S. Pat. No. 6,274,008 to Gopalraja et al., entitled "Integrated Process for Copper Via Filling," both of which are incorporated herein by reference in their entirety. In one version, the magnetic field generator 135 generates a semi-toroidal magnetic field at the target 20. In another version, the magnetic field generator 135 comprises a motor 306 to rotate the magnetic field generator 135 about a rotation axis.

The chamber 106 can be controlled by a controller 194 that comprises program code having instruction sets to operate components of the chamber 106 to process substrates 104 in the chamber 106, as shown for example in FIG. 8. For example, the controller 194 can comprise a substrate positioning instruction set to operate one or more of the substrate support 108 and substrate transport to position a substrate 104 in the chamber 106; a gas flow control instruction set to operate the sputtering gas supply 103 and mass flow controllers 126; a gas pressure control instruction set to operate the exhaust system 128 and throttle valve 137 to maintain a pressure in the chamber 106; a gas energizer control instruction set to operate the gas energizer 190 to set a gas energizing power level; a temperature control instruction set to control temperatures in the chamber 106; and a process monitoring instruction set to monitor the process in the chamber 106.

Although exemplary embodiments of the present invention are shown and described, those of ordinary skill in the art may devise other embodiments which incorporate the present invention, and which are also within the scope of the present invention. For example, other materials other than the exemplary ones described herein can also be deposited. Additional cleaning steps can also be performed to clean the target. Also, targets having different shapes and compositions other than those specifically described can be refurbished. Furthermore, relative or positional terms shown with respect to the exemplary embodiments are interchangeable. Therefore, the appended claims should not be limited to the descriptions of the preferred versions, materials, or spatial arrangements described herein to illustrate the invention.

What is claimed is:

1. A method of refurbishing a deposition target having a pre-sputtered surface with a sputtered depression, the method comprising:
    (a) providing the pre-sputtered surface of the deposition target comprising the sputtered depression, in a process zone;
    (b) generating an electrical arc between first and second electrodes in the process zone, wherein at least one of the first or second electrodes comprises a consumable metal wire that forms liquefied metal; and;
    (c) directing the liquefied metal into the sputtered depression of the deposition target to at least partially fill the sputtered depression with the liquefied metal by injecting a pressurized gas into the process zone to direct the liquefied metal into the sputtered depression, thereby forming a coating comprising the metal in the sputtered depression.

2. A method according to claim 1 wherein (b) comprises generating an electrical arc between an electrode and the surface of the deposition target.

3. A method according to claim 1 wherein the coating comprises at least one of titanium, aluminum, tungsten, tantalum, and copper.

4. A method according to claim 1 wherein the coating comprises at least one of germanium, selenium and tellurium.

5. A method according to claim 1 wherein the coating comprises a plurality of metals.

6. A method according to claim 5 wherein the coating comprises aluminum and at least one of (i) from about 0.25% to about 20% by weight of copper, and (ii) from about 0.25% to about 20% by weight of silicon.

7. A method according to claim 6 wherein in (b) the consumable metal wire comprises an aluminum alloy.

8. A method according to claim 5 wherein the coating comprises a chalcogenide material comprising germanium, selenium and tellurium.

9. A method according to claim 8 wherein in (b) the consumable metal wire comprises a chalcogenide alloy.

10. A method according to claim 1 wherein (c) is repeated to form a plurality of metal layers that form the coating in the sputtered depression on the surface.

11. A method according to claim 10 further comprising exposing the metal layers to an energy source to interdiffuse the metal layers.

12. A method according to claim 11 wherein the metal layers are heated to a temperature of from about 50° C. to about 3000° C.

13. A method according to claim 10 wherein the plurality of metal layers comprises at least one aluminum layer and at least one copper layer, and wherein the aluminum and copper layers are heated to form an interdiffused layer comprising from about 0.25% to about 20% by weight of copper.

14. A method according to claim 10 wherein the plurality of metal layers comprises at least one layer having a chalcogen metal, and wherein the plurality of layers are heated to form an interdiffused layer comprising a chalcogenide material.

15. A method according to claim 14 wherein the chalcogenide material comprises at least one of germanium, selenium and tellurium.

16. A method according to claim 1 further comprising:
(d) exposing the surface of the deposition target to an energy source to recrystallize the metal on the surface.

17. A method according to claim 16 wherein (d) comprises heating the surface to a temperature of from about 50° C. to about 3000° C.

18. A method according to claim 16 wherein (d) comprises directing an electromagnetic energy beam onto the surface to recrystallize the metal.

19. A method according to claim 16 further comprising:
(e) machining the surface of the deposition target to provide a predetermined target thickness.

20. A method according to claim 19 further comprising cleaning the surface of the deposition target to remove machining residues.

21. A method according to claim 20 comprising cleaning the surface with a cleaning solvent.

22. A method of refurbishing a deposition target having a pre-sputtered surface with a sputtered depression, the method comprising:
(a) providing the pre-sputtered surface of the deposition target comprising the sputtered depression, in a process zone;
(b) generating an electrical arc in the process zone between first and second electrodes by applying a voltage to the electrodes, at least one of the first and second electrodes comprising a consumable metal wire, thereby at least partially liquefying the consumable metal wire to form liquefied metal; and
(c) directing liquefied metal into the sputtered depression of the deposition target to at least partially fill the sputtered depression with the liquefied metal by injecting a pressurized gas into the process zone to direct the liquefied metal into the sputtered depression, thereby forming a coating comprising the metal in the sputtered depression.

23. A method according to claim 22 wherein the consumable metal wire comprises at least one of titanium, aluminum, tungsten, tantalum and copper.

24. A method according to claim 22 wherein the consumable metal wire comprises at least one of germanium, selenium and tellurium.

25. A method of refurbishing a deposition target having a pre-sputtered surface with a sputtered depression, the method comprising:
(a) providing the pre-sputtered surface of the deposition target comprising the sputtered depression, in a process zone;
(b) generating an electrical arc in the process zone between the surface of the target and a consumable metal wire by applying a voltage to the target and the consumable metal wire, thereby at least partially liquefying the consumable metal wire in the process zone to form a liquefied metal; and
(c) directing liquefied metal into the sputtered depression of the deposition target to at least partially fill the sputtered depression with the liquefied metal by injecting a pressurized gas into the process zone to direct the liquefied metal into the sputtered depression, thereby forming a coating comprising the metal in the sputtered depression.

26. A method according to claim 25 wherein the consumable metal wire comprises at least one of titanium, aluminum, tungsten, tantalum and copper.

27. A method according to claim 25 wherein the consumable metal wire comprises at least one of germanium, selenium and tellurium.

28. A method of refurbishing a deposition target having a pre-sputtered surface with a sputtered depression, the method comprising:
(a) providing the pre-sputtered surface of the deposition target comprising the sputtered depression, in a process zone;
(b) generating an electrical arc in the process zone between the surface of the target and an electrode by applying a voltage to the target and the electrode;
(c) inserting a consumable metal wire into the process zone to at least partially liquefy the consumable metal wire in the process zone to form liquefied metal; and
(d) directing liquefied metal into the sputtered depression of the deposition target to at least partially fill the sputtered depression with the liquefied metal by injecting a pressurized gas into the process zone to direct the liquefied metal into the sputtered depression, thereby forming a coating comprising the metal in the sputtered depression.

29. A method according to claim 28 wherein the consumable metal wire comprises at least one of titanium, aluminum, tungsten, tantalum and copper.

30. A method according to claim 28 wherein the consumable metal wire comprises at least one of germanium, selenium and tellurium.

31. A method of refurbishing a deposition target having a pre-sputtered surface with a sputtered depression, the method comprising:
(a) providing the pre-sputtered surface of the deposition target comprising the sputtered depression, in a process zone;

(b) generating an electrical arc in the process zone between the surface of the sputtering target and an electrode by applying a voltage to the target and the electrode;

(c) passing the electrical arc through a nozzle to form a plasma jet in the process zone;

(d) directing liquefied metal into the sputtered depression of the deposition target to at least partially fill the sputtered depression with the liquefied metal by inserting a consumable metal wire into the process zone to at least partially liquefy the consumable metal wire in the process zone to form liquefied metal that is directed into the sputtered depression of the deposition target by the plasma jet to at least partially fill the sputtered depression with the liquefied metal; and (e) injecting a pressurized gas into the process zone to reduce contamination of the liquefied metal from the environment.

32. A method according to claim 31 wherein the consumable metal wire comprises at least one of titanium, aluminum, tungsten, tantalum and copper.

33. A method according to claim 31 wherein the consumable metal wire comprises at least one of germanium, selenium and tellurium.

34. A method according to claim 31 wherein the electrode comprises the consumable metal wire.

* * * * *